United States Patent
Weiss et al.

(10) Patent No.: US 10,278,501 B2
(45) Date of Patent: May 7, 2019

(54) LOAD LOCK DOOR ASSEMBLY, LOAD LOCK APPARATUS, ELECTRONIC DEVICE PROCESSING SYSTEMS, AND METHODS

(71) Applicant: Applied Materials, Inc., Santa Clara, CA (US)

(72) Inventors: Eran Weiss, Sunnyvale, CA (US); Travis Morey, Austin, TX (US); Nir Merry, Mountain View, CA (US); Paul B. Reuter, Austin, TX (US); Izya Kremerman, Los Gatos, CA (US); Jeffrey C. Hudgens, San Francisco, CA (US); Dean C. Hruzek, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 329 days.

(21) Appl. No.: 14/689,342

(22) Filed: Apr. 17, 2015

(65) Prior Publication Data

US 2015/0311102 A1 Oct. 29, 2015

Related U.S. Application Data

(60) Provisional application No. 61/984,226, filed on Apr. 25, 2014.

(51) Int. Cl.
*H01L 21/67* (2006.01)
*A47B 96/00* (2006.01)

(52) U.S. Cl.
CPC ........ *A47B 96/00* (2013.01); *H01L 21/67126* (2013.01); *H01L 21/67201* (2013.01)

(58) Field of Classification Search
CPC .................................................. H01L 21/67201

USPC .................................................. 414/411, 217
See application file for complete search history.

(56) References Cited

U.S. PATENT DOCUMENTS

| | | | |
|---|---|---|---|
| 6,045,315 A * | 4/2000 | Azumano | B25J 9/00 414/217 |
| 6,173,938 B1 | 1/2001 | McAndrew | |
| 6,347,918 B1 | 2/2002 | Blahnik | |
| 7,007,919 B2 | 3/2006 | Blonigan et al. | |
| 7,147,424 B2 | 12/2006 | Weaver | |
| 8,061,949 B2 | 11/2011 | Kurita et al. | |
| 8,423,173 B2 * | 4/2013 | Suzuki | H01L 21/67772 414/217 |
| 8,616,820 B2 | 12/2013 | Kurita et al. | |

(Continued)

*Primary Examiner* — Ronald P Jarrett
*Assistant Examiner* — Willie Berry, Jr.
(74) *Attorney, Agent, or Firm* — Dugan & Dugan, PC (57) ABSTRACT

A load lock door assembly with side actuation is disclosed. Load lock door assembly includes a load lock door and a door support assembly coupled thereto. Door support assembly includes one or more pivot members pivotable relative to one or more sides of the load lock body, a door support bracket coupled to the load lock door, one or more separator side actuators coupled between the door support bracket being actuatable to separate the load lock door from a sealing surface, and one or more pivot side actuator operable to pivot the load lock door above or below the load lock entry. Load lock apparatus with side actuation, systems including one or more load lock door assemblies with side actuation, and methods of operating load lock door assemblies are provided, as are numerous other aspects.

12 Claims, 8 Drawing Sheets

(56) References Cited

U.S. PATENT DOCUMENTS

2005/0274923 A1    12/2005   Tanase et al.
2007/0231110 A1*   10/2007   Akiyama .......... H01L 21/67379
                                                                  414/217

* cited by examiner

LOAD LOCK DOOR ASSEMBLY, LOAD LOCK APPARATUS, ELECTRONIC DEVICE PROCESSING SYSTEMS, AND METHODS

RELATED APPLICATION

The present application claims priority to U.S. Provisional Patent Application No. 61/984,226 filed Apr. 25, 2014, and entitled "LOAD LOCK DOOR ASSEMBLY, LOAD LOCK APPARATUS, ELECTRONIC DEVICE PROCESSING SYSTEMS, AND METHODS", which is hereby incorporated by reference herein for all purposes.

FIELD

The present invention relates generally to slit valve doors, and more specifically to doors for load lock apparatus in electronic device processing systems.

BACKGROUND

Conventional electronic device processing systems may include multiple process chambers and one or more load lock chambers surrounding a transfer chamber. These systems may employ a transfer robot that may be housed within the transfer chamber and which is adapted to transport substrates between the various process chambers and one or more load lock chambers.

Conventional load locks include a load lock body and a load lock chamber, a load lock entry into the load lock chamber that is accessed from, for example, a factory interface by a factory interface robot on a factory side of the load lock, and a load lock exit coupled to the transfer chamber. Substrates (e.g., semiconductor wafers) may be placed into and also exit from the load lock chamber through the entry by action of the factory interface robot. Likewise, substrates may enter and exit the transfer chamber through the load lock exit by action of the transfer chamber robot.

Conventional load lock apparatus include an entry load lock door assembly operative with the load lock entry, and an exit load lock door assembly operative with the load lock exit. Such load lock door assemblies may be subject to particle contamination in existing configurations. Moreover, such load lock doors of such assemblies may be difficult to open, and, thus relatively high opening force capability may be provided.

Accordingly, improved load lock door assemblies, load lock apparatus, electronic device processing systems, and methods enabling reduced contamination and/or easier load lock door opening are desired.

SUMMARY

In a first aspect, a load lock door assembly is provided. The load lock door assembly includes a load lock door adapted to seal against a sealing surface proximate to a load lock entry of a load lock body, and a door support assembly coupled to the load lock door, the door support assembly including: one or more pivot member operatively pivotable relative to one or more sides of the load lock body, a door support bracket coupled to the load lock door, one or more separator side actuator coupled between the door support bracket the one or more pivot member and actuatable to separate the load lock door from the sealing surface, and one or more pivot side actuator operable to pivot the load lock door.

In another aspect, a load lock apparatus is provided. The load lock apparatus includes a load lock chamber adapted to be coupled to, and accessed from, a transfer chamber of a mainframe housing and a factory interface chamber, the load lock chamber formed in a load lock body having first side and a second side, a load lock entry, and a sealing surface proximate the entry; and a load lock door assembly operable with the load lock entry, the load lock door assembly including: a load lock door, and a door support assembly coupled between the load lock door and the load lock body, the door support assembly including: a pivot bracket operatively pivotable relative to the first side, a door support bracket coupled to the load lock door, a separator side actuator on the first side operable between the door support bracket and the pivot bracket to separate the load lock door, and a pivot side actuator operable between the pivot bracket and the load lock body to pivot the load lock door.

According to another aspect an electronic device processing system is provided. The electronic device processing system includes a mainframe housing including a transfer chamber housing a robot configured to move substrates; a factory interface having a factory interface chamber; and a load lock apparatus coupled to the mainframe housing and the factory interface, the load lock apparatus including a load lock body and load lock chamber, the load lock chamber accessible from the transfer chamber and the factory interface chamber, a load lock door assembly operable to seal an entry into the load lock chamber from the factory interface chamber, the load lock door assembly including: a load lock door sealable against a sealing surface proximate to the entry; and a door support assembly coupled to the load lock door, the door support assembly including: one or more pivot member operatively pivotable relative to one or more sides of the load lock body, a door support bracket coupled to the load lock door, one or more separator side actuator coupled between the door support bracket the one or more pivot member and actuatable to separate the load lock door from the sealing surface, and one or more pivot side actuator operable to pivot the load lock door.

In another aspect, a method of operating a load lock door assembly is provided. The method includes providing a load lock door assembly including a load lock door sealable against a sealing surface proximate to a load lock entry, and a door support bracket coupled to the load lock door; actuating one or more separator side actuator coupled to the door support bracket to separate the load lock door from the sealing surface; and actuating one or more pivot side actuator to pivot the load lock door.

Numerous other features are provided in accordance with these and other aspects of the invention. Other features and aspects of the present invention will become more fully apparent from the following detailed description, the appended claims and the accompanying drawings.

BRIEF DESCRIPTION OF THE DRAWINGS

The drawings, described below, are for illustrative purposes only and are not necessarily drawn to scale. The drawings are not intended to limit the scope of this disclosure in any way.

FIGS. 2A and 2B illustrate partial perspective views of a load lock apparatus including side actuation according to embodiments, wherein

FIGS. 2C and 2D illustrate partial perspective views of a load lock apparatus including side actuation according to embodiments, wherein

DETAILED DESCRIPTION

Electronic device processing systems (e.g., semiconductor wafer processing tools) utilizing one or more load lock apparatus enable passing of substrates (e.g., wafers) into a vacuum environment and may utilize a load lock door assembly on each load lock apparatus, such as on an entry thereof.

Figure 1:
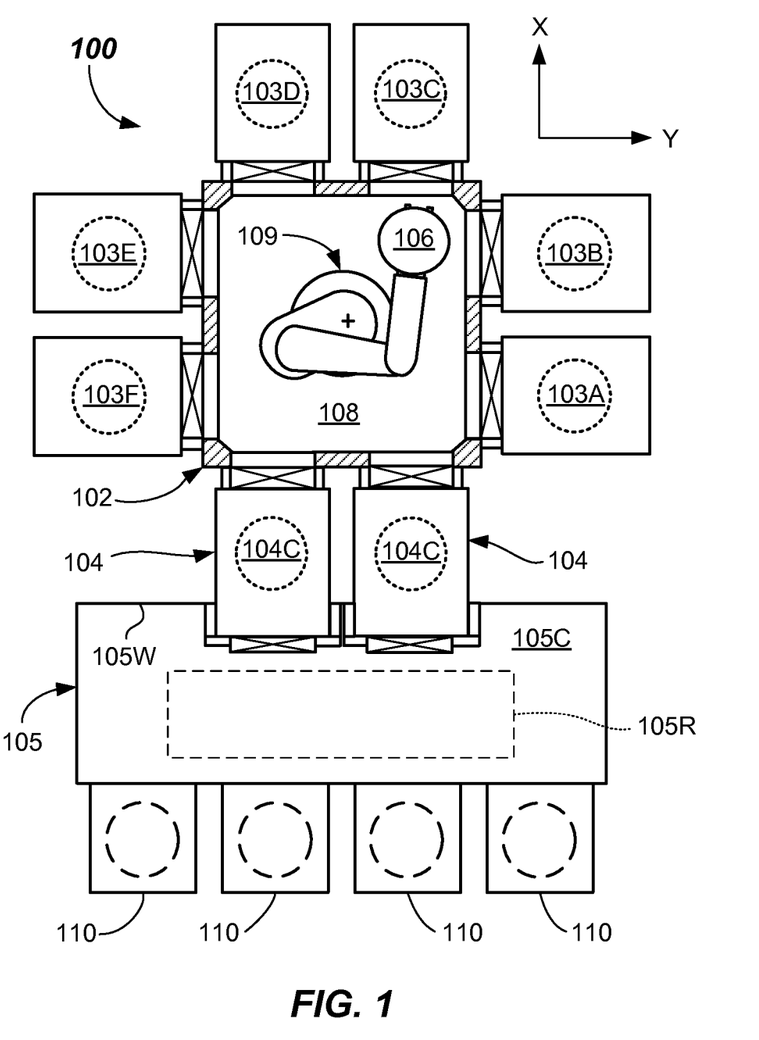
FIG. 1 illustrates a top view of an electronic device processing system including a load lock apparatus including side actuation according to embodiments (shown with top removed for clarity).
Figure 2A:
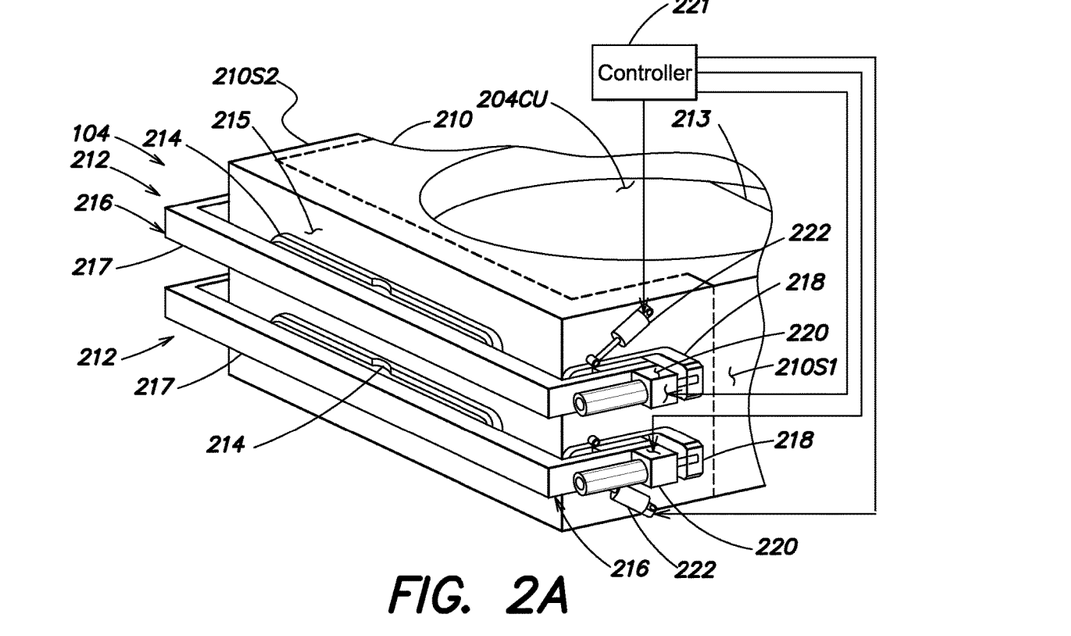
FIG. 2A is a view of the load lock door being in a closed configuration.
Figure 2B:
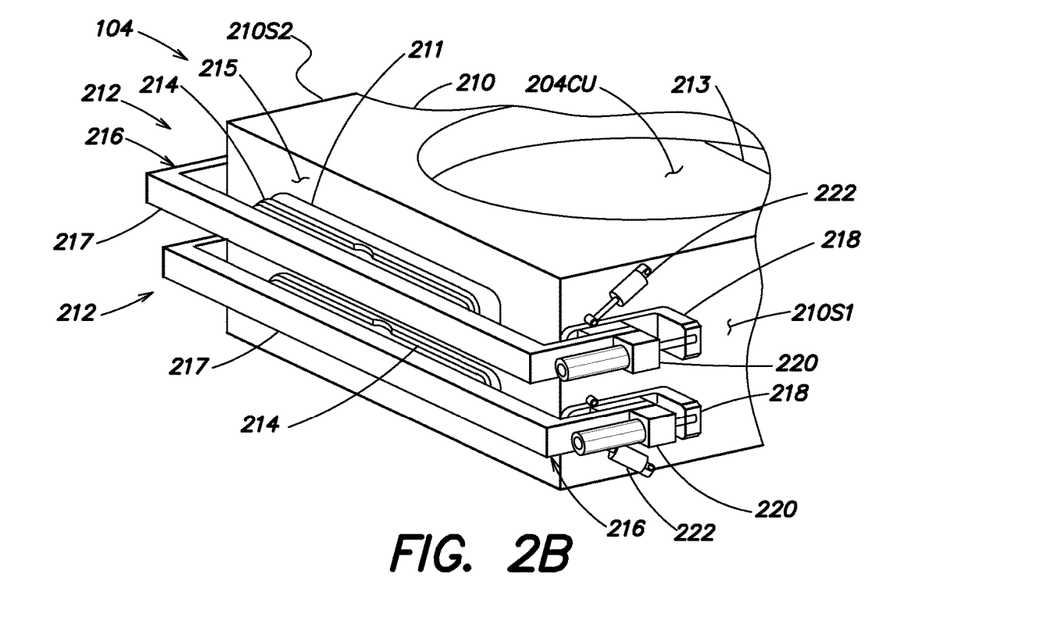
FIG. 2B is a view of an upper load lock door being separated from a sealing surface on the load lock body.
Figure 2C:
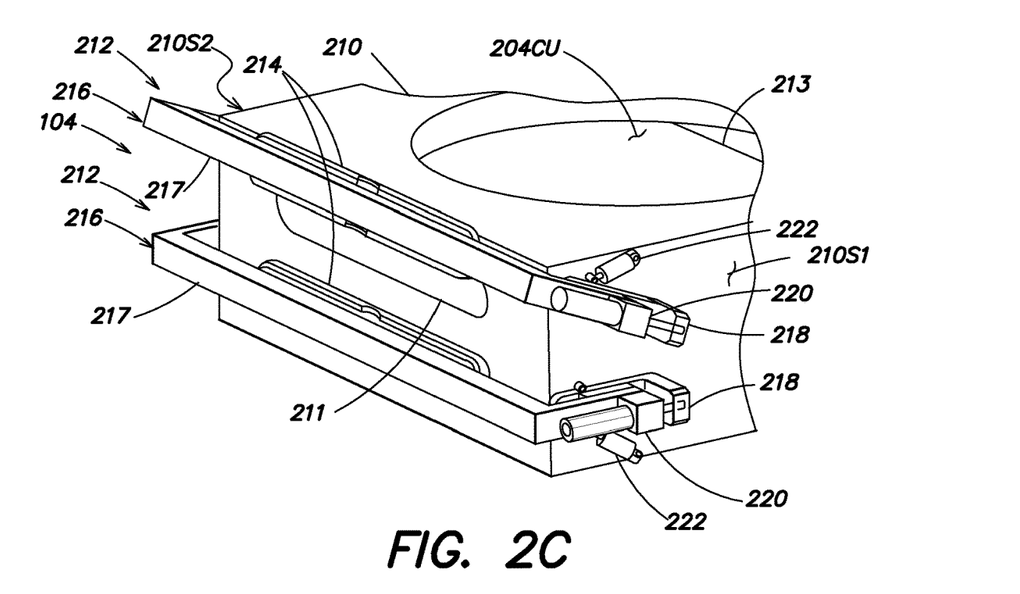
FIG. 2C is a view of an upper load lock door being separated and pivoted.
Figure 2D:
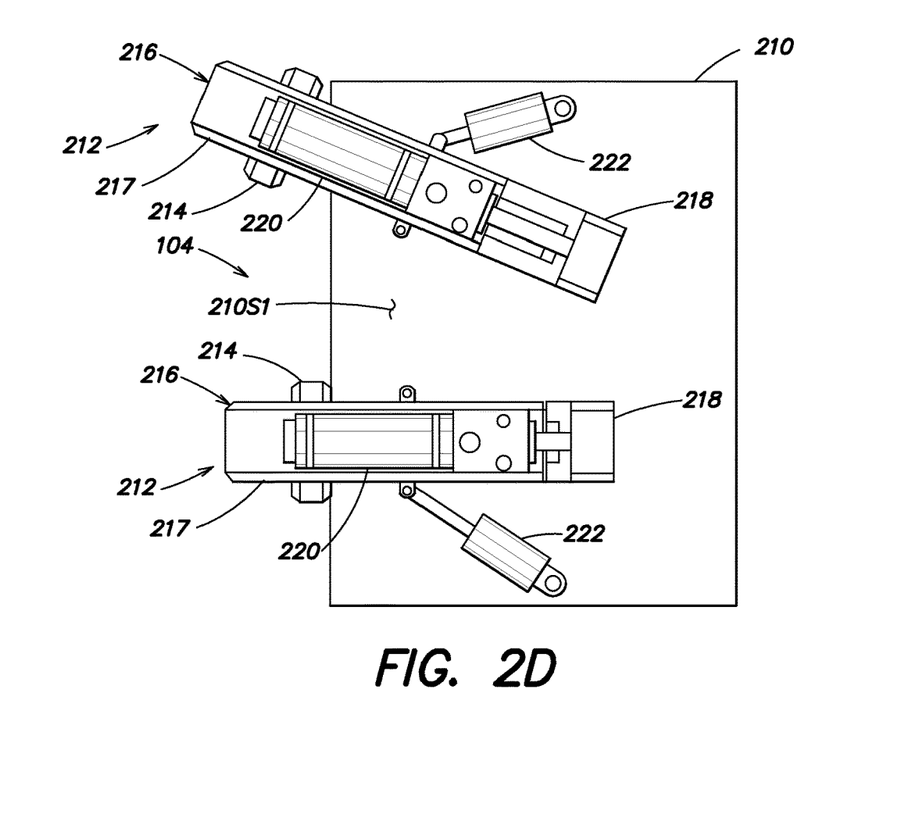
FIG. 2D is a side plan view of the upper load lock door being separated and pivoted.

In accordance with a first aspect, an electronic device processing system 100, as shown in FIG. 1 is provided. The electronic device processing system 100 includes a mainframe housing 102 including walls with facets and may include one or more process chambers 103A-103F coupled to the facets. The processes carried out in the process chambers 103A-103F may comprise at least one selected from a deposition process, an oxide removal process, a nitration process, an etching process, and an annealing process. Other processes may also be carried out therein. The mainframe housing 102 may also include one or more load lock apparatus 104 coupled to facets thereof according to another aspect of the invention. The one or more load lock apparatus 104 may interface with, and be accessible from, a factory interface chamber 105C of a factory interface 105, for example, to enable transfer of substrates 106 into and out of a transfer chamber 108 and to and from substrate carriers 110 (e.g., Front Opening Unified Pods—FOUPs) docked to the factory interface 105. Transfer of substrates 106 to and from the substrate carriers 110 may be by a factory interface robot 105R (shown dotted). A transfer robot 109 may be provided in the transfer chamber 108 and adapted to interface with the process chambers 103A-103F and load lock chambers 104C of the one or more load lock apparatus 104. Any suitable robot type may be used for factory interface robot 105R and the transfer robot 109.

Further details of examples of various embodiments of the invention are described with reference to FIGS. 1-6 herein.

Referring now to FIGS. 1 and 2A-2D, an example of a load lock apparatus 104 according to embodiments of the present invention is disclosed. The load lock apparatus 104 is useful to aid in transfer of substrates 106 between a first area (e.g., a factory interface chamber 105C of the factory interface 105 (FIG. 1)) and the transfer chamber 108 (FIG. 1), wherein each of transfer chamber 108 and factory interface chamber 105C may be at a different pressure or vacuum level. The substrate 106 may be a silicon wafer, which may be an electronic device precursor such as an incomplete semiconductor wafer having a plurality of incomplete chips formed thereon. In some cases, the substrate 106 may have a mask formed or provided thereon. In some embodiments, a vacuum level for the transfer chamber 108 may be between about 0.01 Torr and about 80 Torr, for example, whereas the factory interface 105 may be at or near atmospheric pressure.

Load lock apparatus 104 is adapted to be located between, coupled to, and/or accessed from the transfer chamber 108 and the factory interface chamber 105C. Thus, load lock chambers 104C may be accessible from both the transfer chamber 108 and the factory interface chamber 105C by the transfer robot 109 and the factory interface robot 105R, respectively.

Each load lock apparatus 104 as disclosed, includes as shown in FIGS. 2A-2D, upper load lock chamber 204CU and lower load lock chamber (not shown) that are located at a different vertical levels (e.g., one above the other) and may be separated by a wall. Upper load lock chamber 204CU and lower load lock chamber are adapted to carry out a transfer of a substrate 106 at different times, as will be apparent from the following. Upper load lock chamber 204CU and lower load lock chamber may include standard components therein, such as cooling plates and lift pin assemblies.

Load lock apparatus 104 includes a load lock body 210 of rigid material (e.g., aluminum) connectable to the factory interface 105 and to the mainframe housing 102. Connection may be by way of a mechanical connection, such as by bolting or the like, and may be a sealed connection. In one aspect, the connection to the load lock body 210 interfaces with a wall 105W the factory interface 105. The load lock body 210 may be one integral piece of material in some embodiments.

In the depicted embodiment, the load lock apparatus 104 includes an upper load lock chamber 204CU and a lower load lock chamber (not shown) located below the upper load lock chamber 204CU, each being formed in the load lock body 210. Upper load lock chamber 204CU and lower load lock chamber each include a load lock entry 211 and a load lock exit 213 thereto. Each load lock entry 211 may include a load lock door assembly 212 interfacing therewith. Load lock door assembly 212 may be housed entirely within the factory interface chamber 105C in some embodiments. One possible interface location of the load lock body 210 with wall 105W is shown dotted.

Load lock door assembly 212 includes a load lock door 214 sealable against a sealing surface 215 proximate to and surrounding the load lock entry in a load lock body 210. Load lock door assembly 212 includes a door support assembly 216 coupled to the load lock door 214. Door support assembly 216 includes a door support bracket 217 coupled to the load lock door 214, one or more pivot members 218, one or more separator side actuator 220, and one or more pivot side actuator 222 on one or more sides of the load lock body 210.

The one or more pivot members 218 may be brackets that may be operatively pivotable relative to one or more sides (a first side 210S1 and a second side 210S2, which may be lateral sides) of a load lock body 210 by including any suitable pivot mechanism, such as a step bolt and bushing, or other suitable bearing or pivot device. In the depicted embodiment, the door support bracket 217, which is c-shaped, is coupled to the load lock door 214 (e.g., such as by bolts or screws (not shown), may first translate perpendicularly relative to the sealing surface 215 of the load lock body 210. In this manner, the one or more separator side actuator 220 coupled between the door support bracket 217 and the pivot member 218 may be actuatable to separate the load lock door 214 from the sealing surface 215, i.e., move the load lock door 214 perpendicularly away from the sealing surface 215. Door support bracket 217 may include suitable slide feature to slide on a mating slide feature of the pivot member 218, such as a key and keyway, T-member and T-slot, linear bearing slide, or the like.

The one or more pivot side actuator 222 may be coupled between respective one or more sides (e.g., first side 210S1, and/or second side 210S2) of the load lock body 210 and the pivot member 218 and may be operable to pivot the door support bracket 217 and coupled load lock door 214 up or down. In the depicted embodiment, the load lock door assembly 212 at the upper part of the load lock body 210 is pivoted upwardly to open, and the load lock door assembly 212 at the bottom is pivoted downwardly to open.

Separation side actuators 220 and pivot side actuators 222 may be pneumatic actuators, hydraulic actuators, electric actuators, or the like, for example. Other suitable types of actuators may be used. Suitable control signals to the separation side actuators 220 and pivot side actuators 222 may be generated by a non-transitory computer-readable medium including contents that are configured to cause a processor of a controller 221 to perform a method of operating a load lock door assembly 212.

In particular, signals may be sent from the controller 221 to actuate one or more separator side actuators 220 coupled to the door support bracket 217 to separate the load lock door 214 from the sealing surface 215. Likewise, a signal may be sent from the controller 221 to actuate one or more pivot side actuator 222 to pivot the load lock door 214. Controller 221, shown only in FIG. 2A for clarity, may include suitable processor, memory, analog to digital converters, and other suitable electronics to carry out signal processing, storage, and signal generation operations. A like controller 221 may be provided in the other embodiments described herein.

It should be apparent that the load lock entry 211 to each of the upper load lock chamber 204CU and lower load lock chamber may function as an exit in some embodiments. Likewise, the load lock exit 213 may function as an entry in some embodiments. Accordingly, substrates 106 may pass through the upper load lock chamber 204CU and lower load lock chamber in either direction. Conventional slit valves may be used on the side of the load lock body 210 adjacent to the transfer chamber 108 (on the transfer chamber side). Slit valves on the load lock exit 213 may include any suitable slit valve construction, such as taught in U.S. Pat. Nos. 6,173,938; 6,347,918; and 7,007,919, for example.

The upper load lock chamber 204CU and lower load lock chamber may be of conventional construction, and may include one or more supports adapted to allow one or more substrates 106 to be placed and supported thereon. Supports may be made of any suitable construction, such as pins, pedestals, slots, platforms, or the like. In some embodiments, a lift actuator may be used to lift or lower the one or more supports in the upper load lock chamber 204CU and lower load lock chamber. The upper load lock chamber 204CU and lower load lock chamber may include a cooling plate, and may include a vacuum pump connected thereto. In other embodiments, the substrates may be placed onto a support in the upper load lock chamber 204CU and lower load lock chamber by Z-axis capability of the factory interface robot 105R and/or transfer robot 109.

In the depicted embodiment, a separator side actuator 220 is provided on each of the first side 210S1 and second sides 210S2. Likewise, a pivot side actuator 222 is provided on each of the first side 210S1 and second side 210S2. The construction on the second side 210S2 may be identical to the construction of the first side 210S1. However, it should be recognized that only one pivot side actuator 222, located on either side (e.g., either first side 210S1 or second side 210S2) may be used in some embodiments. Further, only one separator side actuator 220 may be used in some embodiments. The separator side actuator 220 and pivot side actuator 222 may be on opposite sides in some embodiments.

Figure 3A:
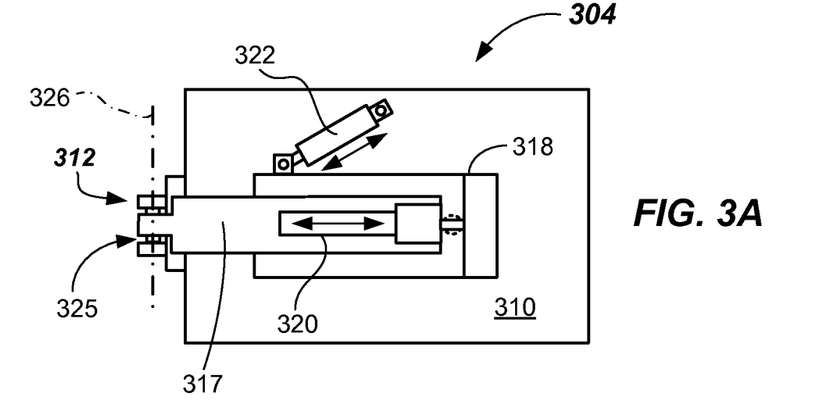
FIG. 3A illustrates a side view of another load lock apparatus including side actuation according to embodiments.
Figure 3B:
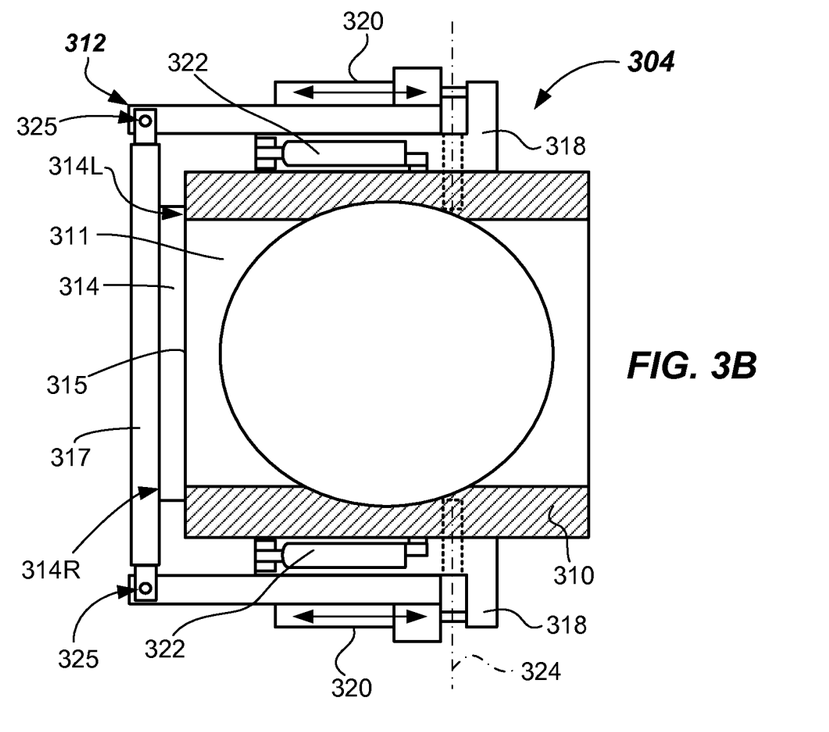
FIG. 3B illustrates a partially cross-sectioned top view of another load lock apparatus including side actuation according to embodiments.
Figure 3C:
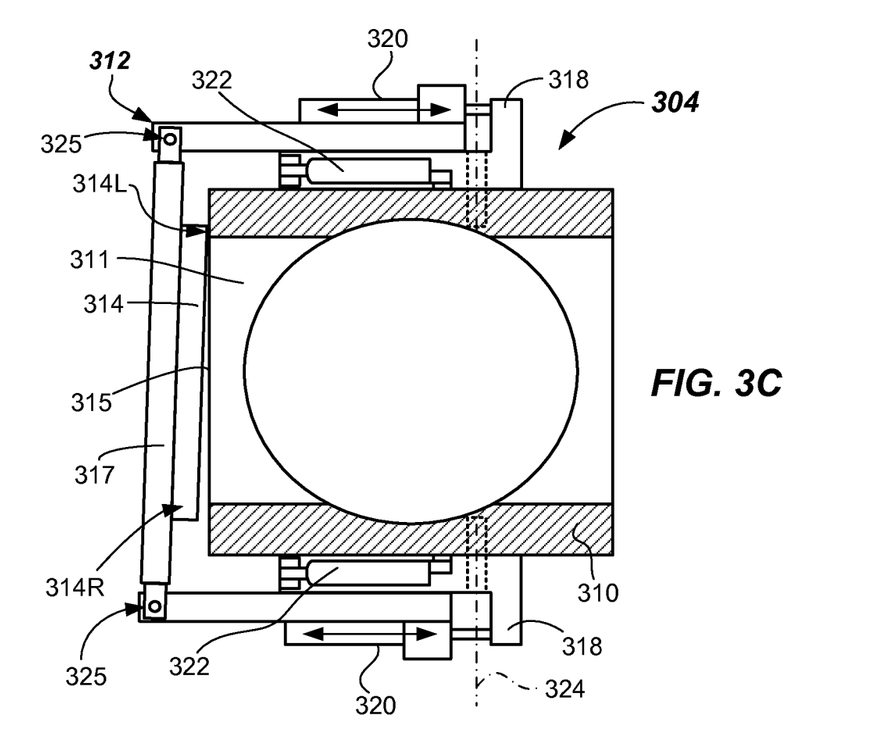
FIG. 3C illustrates a partially cross-sectioned top view of the load lock apparatus including side actuation and shows a first lateral side of the load lock door opening before a second lateral side (door peeling action) according to embodiments.

The embodiment of FIGS. 3A-3C provides an alternative embodiment of a load lock apparatus 304. This embodiment includes a load lock door assembly 312, wherein one of the separator side actuators 320 that may be coupled between the door support bracket 317 and the pivot member 318 on a side of the load lock body 310 is actuatable to open a first lateral side 314R (e.g., a right side) of the load lock door 314 before a second lateral side 314L (e.g., a left side) of the load lock door 314. This differential door separation or peeling action, according to one or more embodiments of the invention, allows the load lock door 314 to be opened with less force when there is some differential pressure acting upon the load lock door 314. By opening one side before the other, the load lock door 314 may, in essence, be zipped open from the sealing surface 315 from one end. Once the vacuum is broken between the load lock entry 311 and the load lock door 314, the other separator side actuator 320 may be actuated to further separate the load lock door 314 from the sealing surface 315.

In operation, the load lock door assembly 312 causes the load lock door 314 to be first separable from the sealing surface 315 of the load lock body 310 using the one or more separator side actuator 320 (e.g., one then the other in this embodiment) and then pivotable about a horizontal axis 324 using the one or more pivot side actuator 322. As can be seen from FIGS. 3A-3C, the door support bracket 317 of the load lock door assembly 312 may include one or more pivot joints 325 allowing first lateral side 314R of the load lock door 314 to be opened before a second lateral side 314L of the load lock door 314 (See FIG. 3C), or vice versa. Thus, the door support bracket 317 and load lock door 314 may pivot about vertical axes 326 (see FIG. 3A) at the pivot joints 325.

Figure 4:
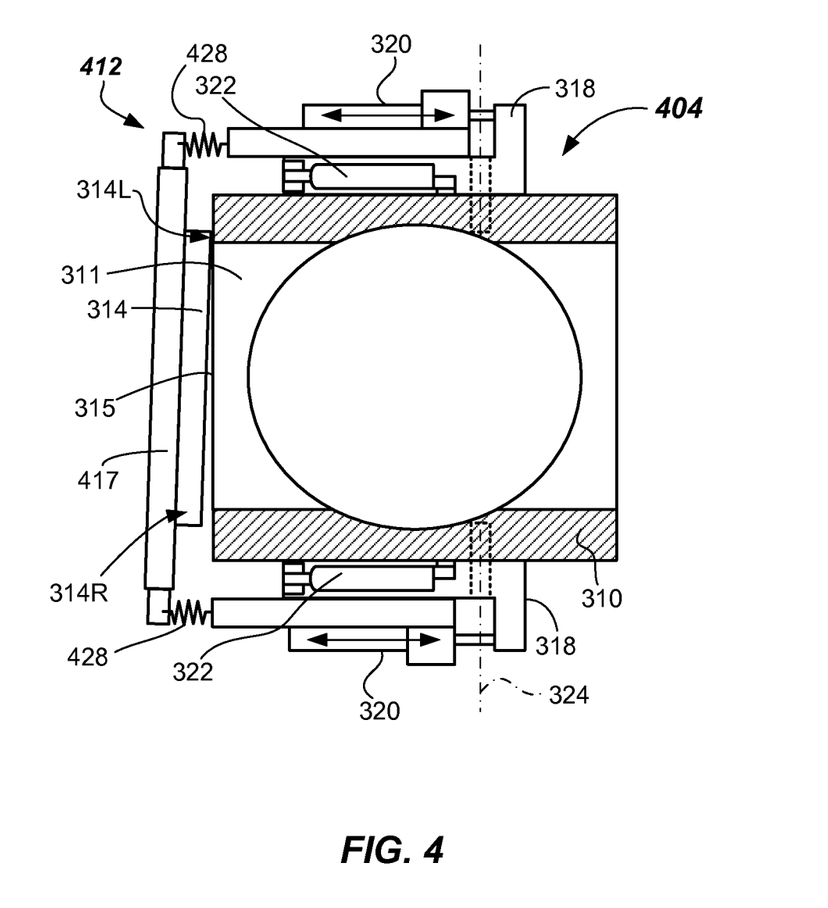
FIG. 4 illustrates a partially cross-sectioned top view of a load lock apparatus including side actuation and a spring allowing a first lateral side of the load lock door to open before a second lateral side (door peeling action) according to embodiments.

The embodiment of FIG. 4 provides an alternative embodiment of a load lock apparatus 404. This embodiment is identical to the FIG. 3A-3C embodiment, except that the load lock door assembly 412 includes a spring 428 providing flexibility and thereby allowing a first lateral side 314R of the load lock door 314 to be opened before a second lateral side 314L of the load lock door 314. In operation, the springs 428 allow the door support bracket 417 and load lock door 314 to pivot about a vertical axis. Any suitable spring may be used.

Figure 5A:
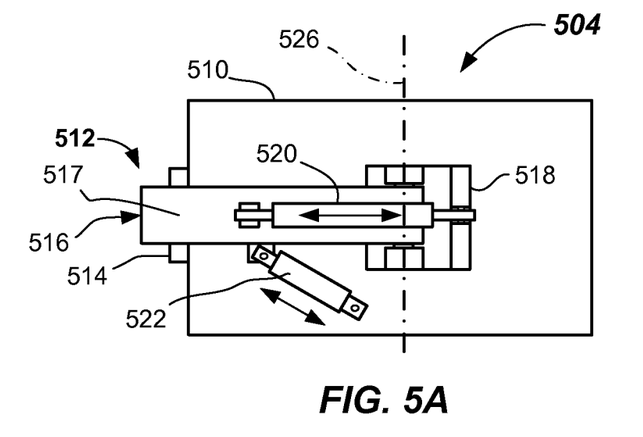
FIG. 5A illustrates a side view of another load lock apparatus including single side actuation according to embodiments.
Figure 5B:
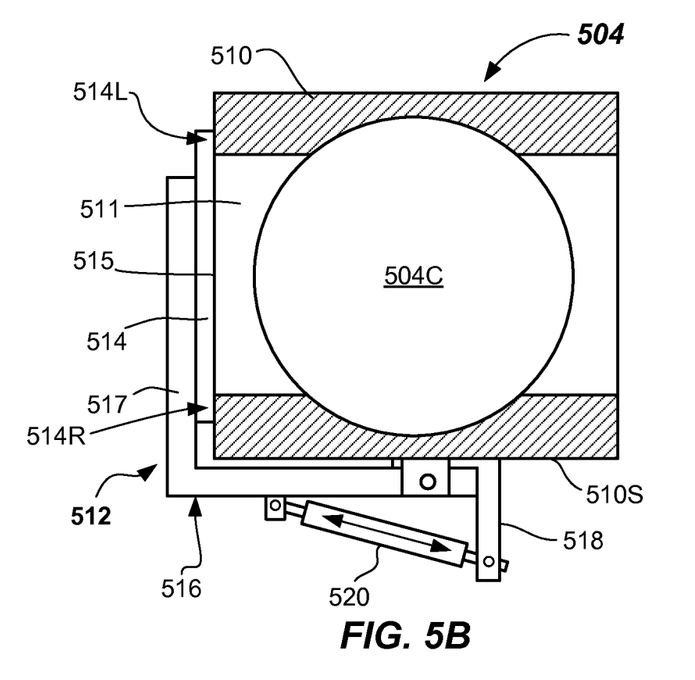
FIG. 5B illustrates a partially cross-sectioned top view of a load lock apparatus including single side actuation according to embodiments.

The embodiment of FIGS. 5A and 5B provides an alternative embodiment of a load lock apparatus 504. This embodiment is identical to those previously described including a load lock body 510 with a load lock chamber 504C therein. A load lock door assembly 512 is operable to seal a load lock door 514 against a sealing surface 515 on the load lock body 510 and seal the load lock entry 511 and also open via pivoting to allow access to the load lock entry 511. Load lock door assembly 512 includes the load lock door 514 and a door support assembly 516 coupled to the load lock door 514. Door support assembly 516 includes a pivot member 518 (e.g., a bracket) operatively pivotable relative to a single side 510S of the load lock body 510, and a door support bracket 517 coupled to the load lock door 514. Coupling may be provided by the door support bracket 517 coupled to the load lock door 514 being made integral in some embodiment. As shown, door support assembly 516 includes a separator side actuator 520 coupled between the door support bracket 517 the pivot member 518 and actuatable to separate the load lock door 514 from the sealing surface 515 or to close same by pivoting about vertical axis 526.

Door support assembly 516 further includes a pivot side actuator 522 operable to pivot the load lock door 514 up or down, like a gull wing. The load lock door 514 and door support bracket 517 each pivot about the vertical axis 526 formed by a pivot joint between the door support bracket 517 and the pivot member 518. This pivoting about the vertical axis 526 allows a first lateral side 514R of the load lock door 514 to be opened before a second lateral side 514L of the load lock door 514 where pivot side actuator 522 is operable to pivot the load lock door 514 up or down to open a path to the load lock entry 511.

Figure 6:
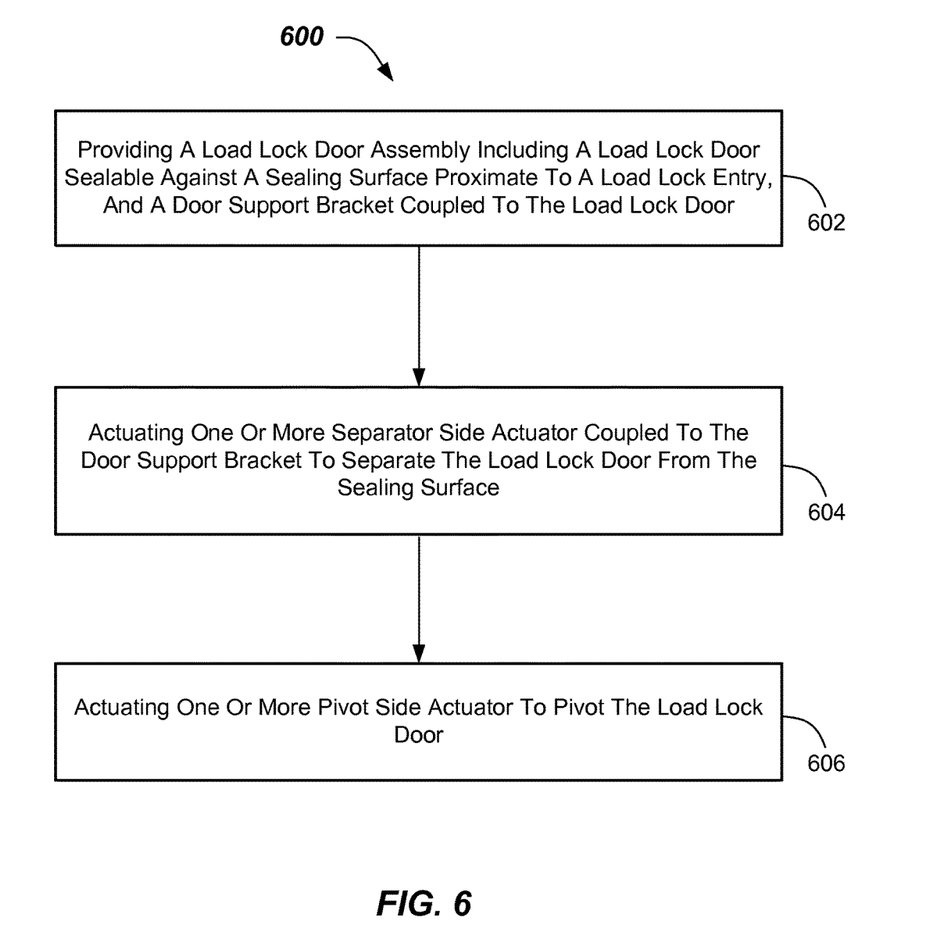
FIG. 6 illustrates a flowchart depicting a method of operating a load lock door assembly according to embodiments.

As shown in FIG. 6, a method 600 of operating a load lock door assembly (e.g., load lock door assembly 212, 312, 412, 512) is provided. The method 600 includes, in 602, providing a load lock door assembly including a load lock door (e.g., load lock door 214, 314, 514) sealable against a sealing surface (e.g., sealing surface 215, 315, 515) proximate to a load lock entry (e.g., load lock entry 211, 311, 511), and a door support bracket (e.g., door support bracket 217, 317, 417, 517) coupled to the load lock door.

The method 600 includes, in 604, actuating one or more separator side actuator (e.g., separator side actuator 220, 320, 520) coupled to the door support bracket to separate the load lock door from the sealing surface; and in 606, actuating one or more pivot side actuator (e.g., pivot side actuator 222, 322, 522) to pivot the load lock door.

The foregoing description discloses only example embodiments of the invention. Modifications of the above-disclosed load lock door assemblies, load lock apparatus, systems, and methods which fall within the scope of the invention will be readily apparent to those of ordinary skill in the art. Accordingly, while the present invention has been disclosed in connection with example embodiments thereof, it should be understood that other embodiments may fall within the scope of the invention, as defined by the following claims.

The invention claimed is:

1. A load lock door assembly, comprising:
 a load lock door adapted to seal against a sealing surface proximate to a load lock entry of a load lock body, the load lock door having a first lateral side and a second lateral side; and
 a door support assembly coupled to the load lock door, the door support assembly including:
   one or more pivot members operatively pivotable relative to one or more sides of the load lock body,
   a door support bracket coupled to the load lock door,
   a first separator side actuator coupled between the door support bracket and a first one of the one or more pivot members, a second separator side actuator coupled between the door support bracket and a second one of the one or more pivot members, the first separator side actuator and the second separator side actuator configured to actuate sequentially to separate the first lateral side of the load lock door from the sealing surface before the second lateral side of the load lock door, and one or more pivot side actuators operable to pivot the load lock door;
 wherein the first separator side actuator is disposed on the load lock body at a first side of the load lock body, and the one or more pivot members include a slide feature that is configured to mate with a slide feature of the door support bracket.

2. The load lock door assembly of claim 1, wherein the load lock door and the door support assembly are housed in a factory interface chamber.

3. The load lock door assembly of claim 1, wherein the second separator side actuator is disposed on a second side of the load lock body.

4. The load lock door assembly of claim 1, wherein the load lock door is first separable using the first separator side actuator and the second separator side actuator, and then pivotable using the one or more pivot side actuators.

5. The load lock door assembly of claim 1, wherein
 a first pivot member of the one or more pivot members is disposed on the first side of the load lock body,
 the first separator side actuator is disposed on the first side of the load lock body;
 a first pivot side actuator of the one or more pivot side actuators is disposed on the first side of the load lock body;
 a second pivot member of the one or more pivot members is disposed on a second side of the load lock body,
 the second separator side actuator is disposed on the second side of the load lock body; and
 a second pivot side actuator of the one or more pivot side actuators is disposed on the second side of the load lock body.

6. The load lock door assembly of claim 1, further comprising a linear slide configured and operative to allow translation of the door support bracket relative to a first pivot member of the one or more pivot members.

7. The load lock door assembly of claim 1, wherein the door support bracket and load lock door pivot about a vertical axis.

8. A load lock door assembly, comprising:
 a load lock door adapted to seal against a sealing surface proximate to a load lock entry of a load lock body; and
 a door support assembly coupled to the load lock door, the door support assembly including:
   one or more pivot members operatively pivotable relative to one or more sides of the load lock body,
   a door support bracket coupled to the load lock door,
   one or more separator side actuators respectively coupled between the door support bracket and the one or more pivot members, and actuatable to separate the load lock door from the sealing surface, and
   one or more pivot side actuators operable to pivot the load lock door;

wherein a first separator side actuator of the one or more separator side actuators is disposed on the load lock body at a first side of the load lock body, and wherein at least one of the one or more pivot members comprises a first slide portion configured and operative to slidably receive a second slide portion of the door support bracket, a first actuation support adapted to couple to a first one of the one or more separator side actuators, and a second actuation support adapted to couple to a first one of the one or more pivot side actuators.

9. A load lock door assembly, comprising:
a load lock door adapted to seal against a sealing surface proximate to a load lock entry of a load lock body, the load lock door having a first side and a second side; and
a door support assembly coupled to the load lock door, the door support assembly including:
one or more pivot members operatively pivotable relative to one or more sides of the load lock body,
a door support bracket coupled to the load lock door,
one or more separator side actuators respectively coupled between the door support bracket and the one or more pivot members, and actuatable to separate the load lock door from the sealing surface, and
one or more pivot side actuators operable to pivot the load lock door;
wherein a first separator side actuator of the one or more separator side actuators is disposed on the load lock body at a first side of the load lock body, and the one or more pivot members include a slide feature that is configured to mate with a slide feature of the door support bracket, and wherein the door support bracket comprises a pivot joint allowing the first side of the load lock door to be opened before the second side of the load lock door.

10. A load lock door assembly, comprising:
a load lock door adapted to seal against a sealing surface proximate to a load lock entry of a load lock body, the load lock door having a first side and a second side; and
a door support assembly coupled to the load lock door, the door support assembly including:
one or more pivot members operatively pivotable relative to one or more sides of the load lock body,
a door support bracket coupled to the load lock door,
one or more separator side actuators respectively coupled between the door support bracket and the one or more pivot members, and actuatable to separate the load lock door from the sealing surface, and
one or more pivot side actuators operable to pivot the load lock door;
wherein a first separator side actuator of the one or more separator side actuators is disposed on the load lock body at a first side of the load lock body, and the one or more pivot members include a slide feature that is configured to mate with a slide feature of the door support bracket, and wherein the door support bracket comprises a flexibility allowing the first side of the load lock door to be opened before the second side of the load lock door.

11. A load lock apparatus, comprising:
a load lock chamber adapted to be coupled to, and accessed from, a transfer chamber of a mainframe housing and a factory interface chamber, the load lock chamber formed in a load lock body having a first side and a second side, a load lock entry, and a sealing surface proximate the load lock entry; and
a load lock door assembly operable with the load lock entry, the load lock door assembly including:
a load lock door, the load lock door having a first lateral side and a second lateral side and
a door support assembly coupled between the load lock door and the load lock body, the door support assembly including:
a pivot bracket operatively pivotable relative to the first side,
a door support bracket coupled to the load lock door,
a first separator side actuator coupled between the door support bracket and a first pivot member, a second separator side actuator coupled between the door support bracket and a second pivot member, the first separator side actuator and the second separator side actuator configured to actuate sequentially to separate the first lateral side of the load lock door from the sealing surface before the second lateral side of the load lock door, and
a pivot side actuator operable between the pivot bracket and the load lock body to pivot the load lock door,
wherein the pivot bracket includes a slide feature that is configured to mate with a slide feature of the door support bracket.

12. An electronic device processing system, comprising:
a mainframe housing including a transfer chamber housing a robot configured to move substrates;
a factory interface having a factory interface chamber; and
a load lock apparatus coupled to the mainframe housing and the factory interface, the load lock apparatus including a load lock body and a load lock chamber, the load lock chamber accessible from the transfer chamber and the factory interface chamber, a load lock door assembly operable to seal an entry into the load lock chamber from the factory interface chamber, the load lock door assembly including:
a load lock door sealable against a sealing surface proximate to the entry, the load lock door having a first lateral side and a second lateral side; and
a door support assembly coupled to the load lock door, the door support assembly including:
one or more pivot members operatively pivotable relative to one or more sides of the load lock body,
a door support bracket coupled to the load lock door,
a first separator side actuator coupled between the door support bracket and a first one of the one or more pivot members, a second separator side actuator coupled between the door support bracket and a second one of the one or more pivot members, the first separator side actuator and the second separator side actuator configured to actuate sequentially to separate the first lateral side of the load lock door from the sealing surface before the second lateral side of the load lock door, and
one or more pivot side actuator operable to pivot the load lock door
wherein the one or more pivot members includes a slide feature that is configured to mate with a slide feature of the door support bracket.

* * * * *